United States Patent
Jow et al.

(10) Patent No.: US 7,528,433 B2
(45) Date of Patent: May 5, 2009

(54) CAPACITOR STRUCTURE

(75) Inventors: Uei-Ming Jow, Taichung (TW);
Chang-Sheng Chen, Taipei (TW);
Ying-Jiunn Lai, Pingtung County (TW);
Chin-Sun Shyu, Pingtung County (TW)

(73) Assignee: Industrial Technology Research Institute, Hsinchu (TW)

( * ) Notice: Subject to any disclaimer, the term of this patent is extended or adjusted under 35 U.S.C. 154(b) by 176 days.

(21) Appl. No.: 11/456,094

(22) Filed: Jul. 7, 2006

(65) Prior Publication Data

US 2007/0222031 A1    Sep. 27, 2007

(30) Foreign Application Priority Data

Mar. 21, 2006   (TW) ............... 95109607 A

(51) Int. Cl.
*H01L 29/00*   (2006.01)
(52) U.S. Cl. .............. 257/307; 257/308; 257/516; 257/532
(58) Field of Classification Search ................ 257/307, 257/308, 516, 532, E27.048
See application file for complete search history.

(56) References Cited

U.S. PATENT DOCUMENTS

| | | |
|---|---|---|
| 5,079,069 A | 1/1992 | Howard et al. |
| 5,161,086 A | 11/1992 | Howard et al. |
| 5,744,853 A | 4/1998 | Quek et al. |
| 5,770,499 A | 6/1998 | Kwok et al. |
| 5,972,053 A | 10/1999 | Hoffarth et al. |
| 6,022,775 A | 2/2000 | Tsai et al. |
| 6,211,008 B1 | 4/2001 | Yu et al. |
| 6,933,805 B1 | 8/2005 | Norte et al. |
| 2007/0057344 A1* | 3/2007 | Lee .......................... 257/532 |

* cited by examiner

*Primary Examiner*—Evan Pert
*Assistant Examiner*—Tan N Tran
(74) *Attorney, Agent, or Firm*—Jianq Chyun IP Office

(57) ABSTRACT

A capacitor structure with a cross-coupling design is provided. In the capacitor structure, conductive lines or electrode plates are coupled together by cross coupling an electrode above or below or aside the other electrode. By cross coupling and fewer vias, the largest capacitance value can be obtained within a minimum area. The capacitor structure provided can also be applied to a high-frequency high-speed module or system to enhance noise inhibition capability of a capacitive substrate.

15 Claims, 17 Drawing Sheets

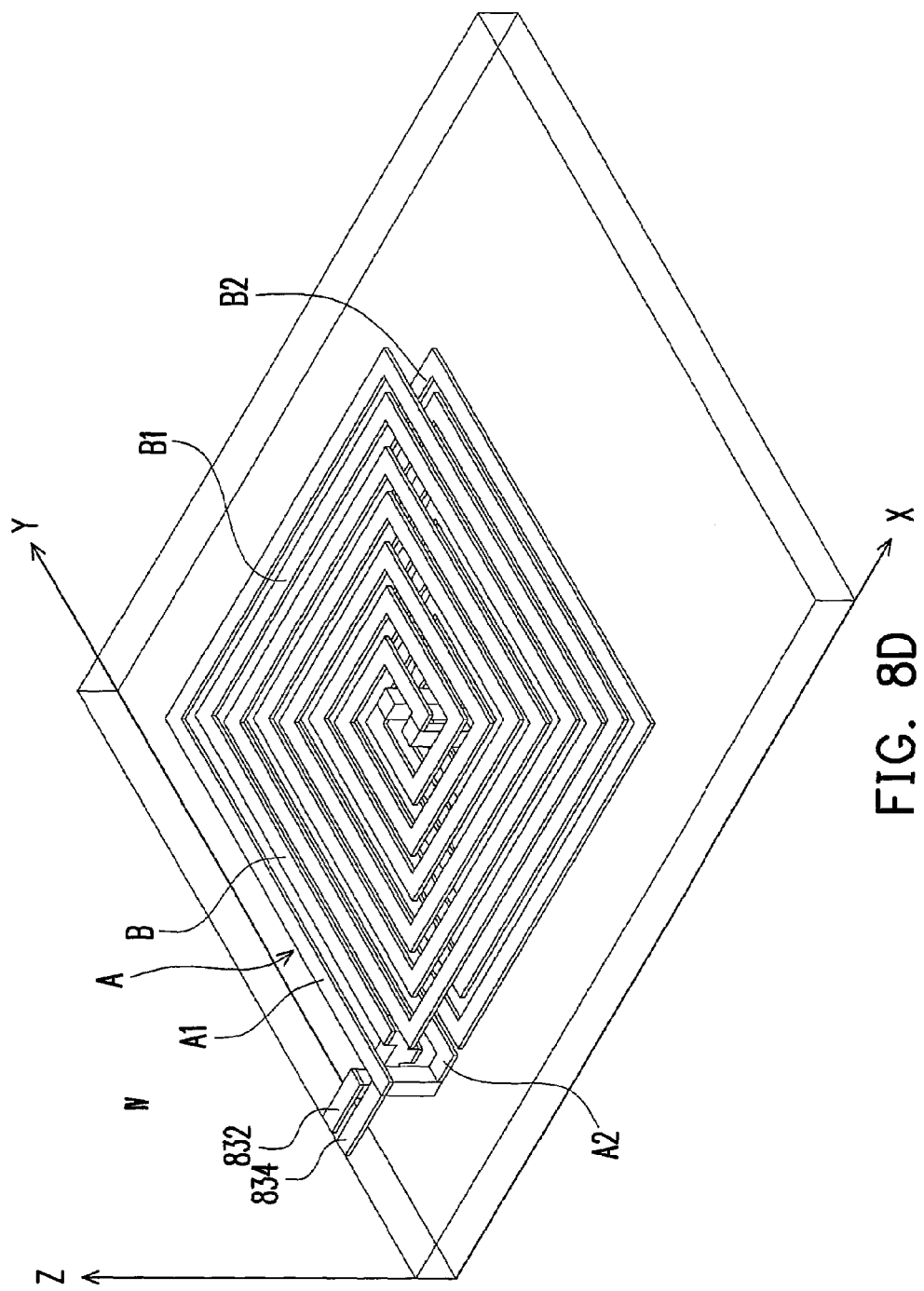

CAPACITOR STRUCTURE

CROSS-REFERENCE TO RELATED APPLICATION

This application claims the priority benefit of Taiwan application serial no. 95109607, filed on Mar. 21, 2006. All disclosure of the Taiwan application is incorporated herein by reference.

BACKGROUND OF THE INVENTION

1. Field of the Invention

The present invention relates to a capacitor structure. More particularly, the present invention relates to a built-in capacitor structure with an elongated electrode plates to achieve top, bottom, and side cross coupling of the electrode plates, so as to enhance the capacitance.

2. Description of Related Art

In a circuit of modern high-frequency and high-speed electronic system products, e.g. Intel INTEL Pentium-4 CPU circuit substrates, or personal computer motherboards, or mobile phone printed circuit boards, in order to filter various electric noises from the system and stabilize the voltage, several capacitor devices must be added in parallel between a power end and a ground end (e.g. between 5 V and the ground end, or between 3.3 V and the ground end). The capacitor devices are also known as decoupling capacitors. Commonly, the devices functioning as the decoupling capacitor adopt mainly two technologies, namely the discrete component capacitors, e.g. the Surface Mount Technology (SMT) capacitors and the newly developed capacitive substrate provided with decoupling function.

The discrete capacitor has at least the deficiencies that the operating frequency band range is not wide enough, the AC impedance is not low enough, and the system in package cannot be realized, and so on. The current capacitive substrate devices have the defect of a strong via electric parasite effect. Further, the capacitive substrate only has a 2D plane structure. Therefore, this design has the problems of a large area, a great deal of electrical power consumption for the dielectric material of the capacitor, and so on.

Early printed circuit boards usually employed plane substrates of the same dielectric coefficient, e.g. glass fiber cloth (FR4) substrates, which has the disadvantages that the noise inhibition effect is poor at high frequency, and the integration level of the passive components is relatively low. It is improved, for example, in the plane substrate with the inner layer made of different dielectric materials, which is disclosed in U.S. Pat. Nos. 5,079,069 and 5,161,086, so as to enhance the electrical characteristics of the capacitive character among the circuit boards to inhibit the noise. Therefore, the disadvantages of the plane substrate can be reduced. However, as for the modern high-frequency analog and high-speed digital integrated electronic system, it is a double-layer electrode plate occupies areas and compared with the electrode plate of the same area, the side space that can be applied is reduced.

In the CAPACITOR LAMINATE FOR USE IN CAPACITIVE PRINTED CIRCUIT BOARDS AND METHODS OF MANUFACTURE disclosed by the U.S. Pat. No. 5,161,086 assigned to Zycon, published on Nov. 3, 1992, the principle is that the substrate with the same dielectric coefficient is provided on the same plane, and has a conductive metal layer adhered to the upper and lower surfaces to constitute a plane capacitive substrate. The printed circuit board 100 as shown in FIG. 1A has a capacitor laminate structure 110 with two metal layers 112 and 114 and a dielectric layer 116 sandwiched between the two metal layers 112 and 114. Conductive lines 122 and 124 are used to connect to other conductive layer structure, e.g. the conductive layer structure 130 as shown in the figure.

The above structure has the upper side and lower side connected by vias, and when being laminated with other conventional printed circuit board, the structure can provide a function as a capacitor to inhibit the noise. Referring to FIG. 1B, in addition to the above application, the electrode plate can also adopt a multi-layer design. In addition to the former structure, a capacitor laminate 140 structure is further added, which includes two metal layers 142 and 144 and a dielectric layer 146 sandwiched between the two metal layers 142 and 144. The leads 122 and 124 are used to connect to the other conductive layer structure of the other layer, e.g. the conductive layer structure 130 as shown in the figure. However, the multi-layer structure may cause an increase of the length of the vias and affect the electric effect.

Additionally, referring to FIG. 1C, it is a microscopic structure of a single electrode plate. As known from the microscopic structure, the disadvantage lies in that the single electrode plate cannot exert the advantage of edge coupling, and the area occupied is relatively large. Further, with the design of the vias, not only is the inductive effect enhanced and the applied frequency range reduced, but also the area of the underlayer is occupied. The design is directed to the application to the ground decoupling capacitor, and does not have significant effect on the application to the capacitors connected in series.

Further, in the CAPACITOR FORMED WITH PRINTED CIRCUIT BOARDS disclosed by the U.S. Pat. No. 5,972,053 assigned to International Business Machine, published on Oct. 26, 1999, a design of electrode plate is provided, which can also adopt a multi-layer design as shown in FIG. 2A. As shown in the drawing, in the printed circuit board 200, two resistors 210 and 220 are sandwiched between the dielectric layers 202, 204, and 206, and connected to the outer conductive layer by the vias 232, 234, and 236. However, the multi-layer structure may cause an increase of the length of the vias and affect the electrical effect. FIG. 2B is a microscopic structure of a single electrode plate. The design of the electrode plate has a disadvantage that the single electrode plate cannot exert the advantage of the edge coupling, and the area occupied is relatively large. Further, with the design of the vias, not only is the inductive effect enhanced and the applied frequency range reduced, but also the area of the underlayer is occupied.

In another conventional technology, a high-density capacitor is achieved by increasing the surface area of the structure in the process of the semiconductor integrated circuit. However, the effect is limited. Actually, the stereo-crossing structure can be used to increase the surface area. For example, in the THREE DIMENTIONAL POLYSILICON CAPACITOR FOR HIGH DENSITY INTEGRATED CIRCUIT APPLICATIONS disclosed by the U.S. Pat. No. 5,744,853, published on Apr. 28, 1998, a design of the stereo-crossing structure being used for increasing the surface area is provided, so as to achieve the requirement of the high-density capacitor. Referring to FIG. 3, the triple-layer structure of a patterned polysilicon layer 310, an insulator layer 320, and another patterned polysilicon layer 330 forms a capacitor with a stereo-crossing structure.

SUMMARY OF THE INVENTION

Accordingly, the object of the present invention is to make use of the electrode plate with the elongated electrical path to improve the capacitance, in which the electrode plate has one end connection or double end connection structures on the two ends, so as to achieve the cross coupling of the top, bottom, and side.

In the capacitor structure, leads or electrode plates are coupled through coupling an electrode above or below or aside the other electrode. By cross coupling and with fewer vias, the largest capacitance value can be obtained within a minimum area.

The capacitor structure provided by the present invention can also be applied to a high-frequency high-speed module or system to enhance noise inhibition capability of the capacitive substrate. It also has a design of the minimum area when being applied in common circuit design, thus satisfying the object of the compact package of the electronic system.

In an embodiment of the present invention, a capacitor structure is provided. The capacitor structure comprises a dielectric material layer, a first electrode, and a second electrode. The dielectric material layer is located between the first electrode and the second electrode. The first electrode includes a first electrode layer and a second electrode layer connected together, and the second electrode includes a third electrode layer and a fourth electrode layer connected together. The first electrode layer and the third electrode layer are located on a first plane, and the second electrode layer and the fourth electrode are located on a second plane that is parallel to the first plane. The fourth electrode layer is under the first electrode layer, and the second electrode layer is under the third electrode layer.

In the capacitor structure, all the electrode layers are flat conductive layers and are spaced apart in parallel with each other.

In an embodiment, the electrical path of the first electrode is a double end connection structure extending from the first electrode layer to the second electrode layer, and then passing from the second electrode to the first electrode layer. The electrical path of the second electrode is a double end connection structure extending from the third electrode layer to the fourth electrode layer, and then passing from the fourth electrode layer to the third electrode layer.

In another embodiment, the electrical path of the first electrode is a double end connection structure extending from the two ends of the first electrode layer to the two ends of the second electrode layer. The electrical path of the second electrode is a double end connection structure extending from the two ends of the third electrode layer to the two ends of the fourth electrode layer.

In the capacitor structure, all the electrode layers can also be strip-shaped conductive layers. The first electrode layer and the third electrode layer are spirally wound in parallel in a first direction, and after reaching the central position, the second electrode layer and the fourth electrode layer are spirally wound in parallel in a second direction opposite to the first direction.

In another embodiment of the present invention, a capacitor structure is provided, which comprises a plurality of dielectric material layers, a first electrode, and a second electrode, and has multi-layer structures. The dielectric material layers are located between the first electrode and the second electrode. The first electrode includes a plurality of first electrode layers connected together, and the second electrode includes a plurality of second electrode layers connected together. In the multi-layer structures, the first electrode layers and the second electrode layers are disposed in parallel on the plane of each layer, and the second electrode layers are disposed above and/or under each of the first electrode layers, and the first electrode layers are disposed above and/or under each of the second electrode layers.

In the capacitor structure, the first electrode layers and the second electrode layers are flat conductive layers and are spaced apart in parallel with each other. And in an embodiment, the manner of connecting each electrode layer of the first electrode is a one end connection, and the manner of connecting each electrode layer of the second electrode is a one end connection (i.e. the same electrode has only one contact among different layers). In another embodiment, the manner of connecting each electrode layer of the first electrode is a double end connection, and the manner of connecting each electrode layer of the second electrode is a double end connection.

In order to the make aforementioned and other objects, features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 8A-FIG. 8D are schematic side views of the built-in capacitor structures of the I-type structure to the IV-type structure.

DESCRIPTION OF EMBODIMENTS

The present invention aims at employing the electrode plate with the elongated electrical path for increasing the capacitance, and the electrode plate has a one end connection or double-end connection structure on both ends, so as to achieve the cross coupling at the upper, lower, left, and right parts and thereby increasing the capacitance. The shape of the electrode plate is not limited.

As for the built-in capacitor structure of the present invention, the elongated electrical path is utilized to achieve the cross coupling at the upper, lower, left, and right parts, and conductive lines or electrode plates are coupled through coupling an electrode above or below or aside the other electrode. By cross coupling and with fewer vias, the largest capacitance value can be obtained within a minimum area.

The built-in capacitor structure provided in the present invention can also be applied to a high-frequency high-speed module or system to enhance noise reduction capability of the capacitive substrate. If it is applied to common circuit designs, the minimum area design may be achieved as well, such that it meets the object of system in package for the electronic system in the future.

Figure 1A:
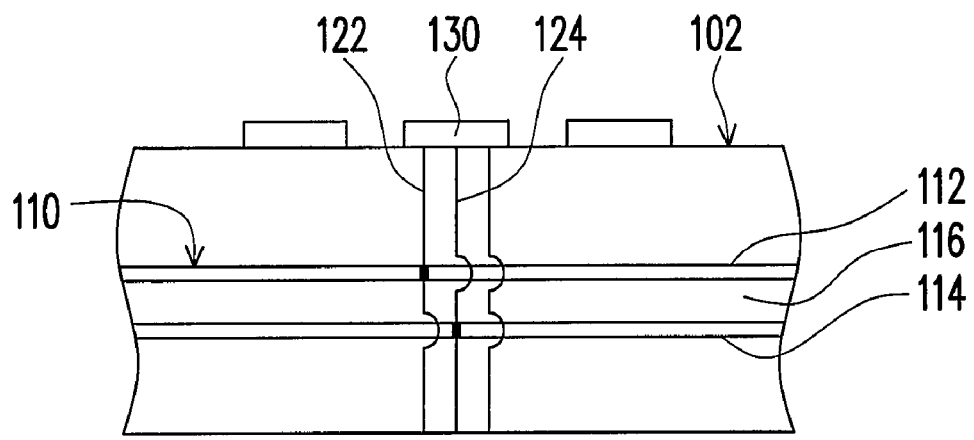
FIG. 1A-FIG. 1C are schematic views of capacitor laminate structures of a conventional printed circuit board.
Figure 1B:
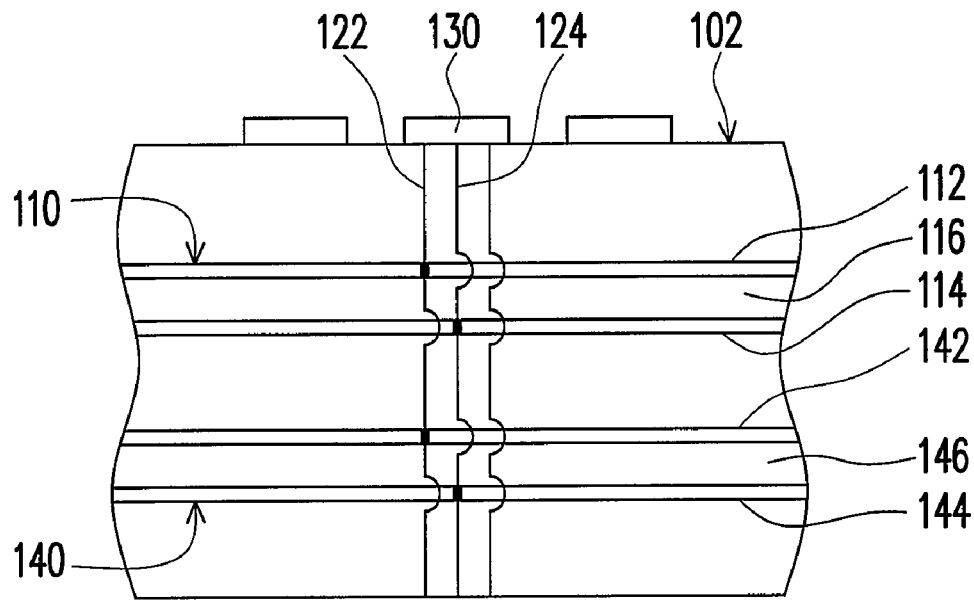
Figure 1C:
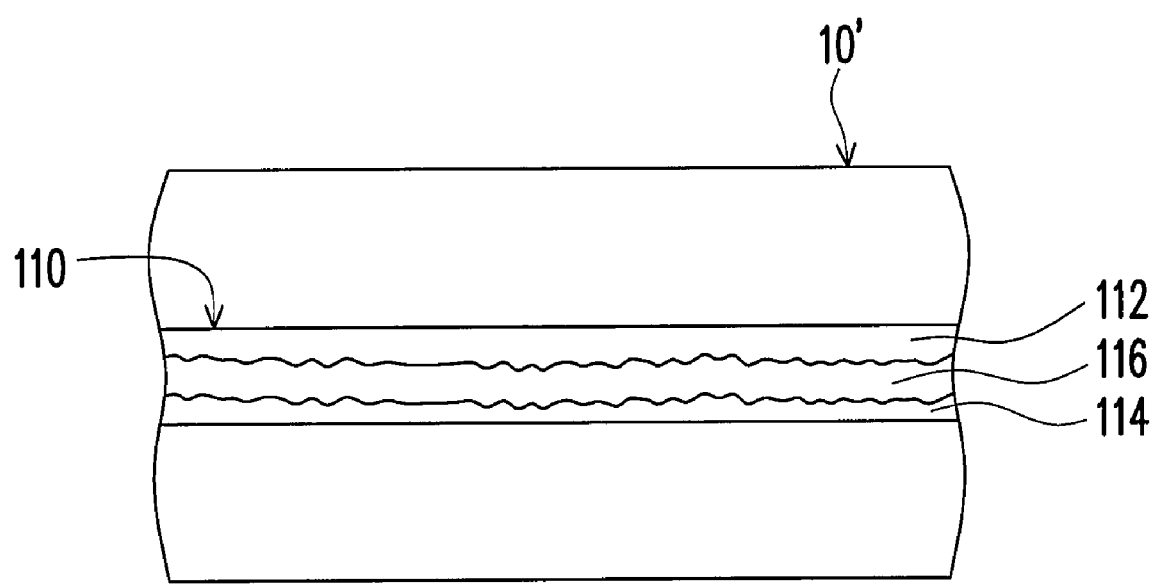
Figure 2A:
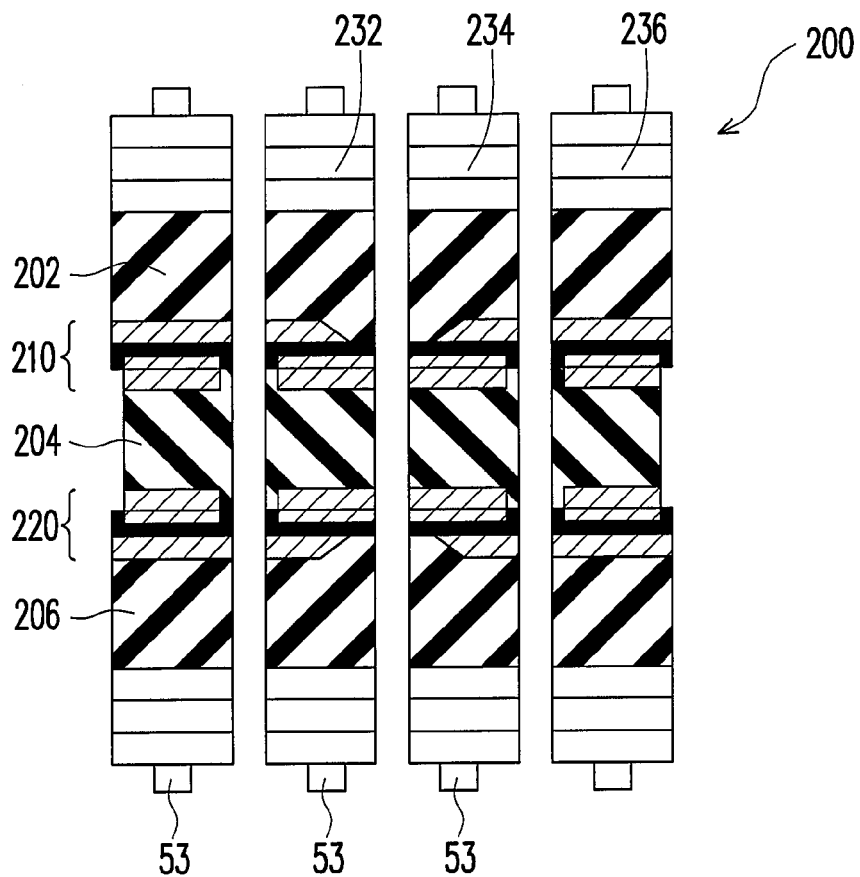
FIG. 2A and FIG. 2B are schematic views of resistor structures of a conventional multi-layer printed circuit board.
Figure 2B:
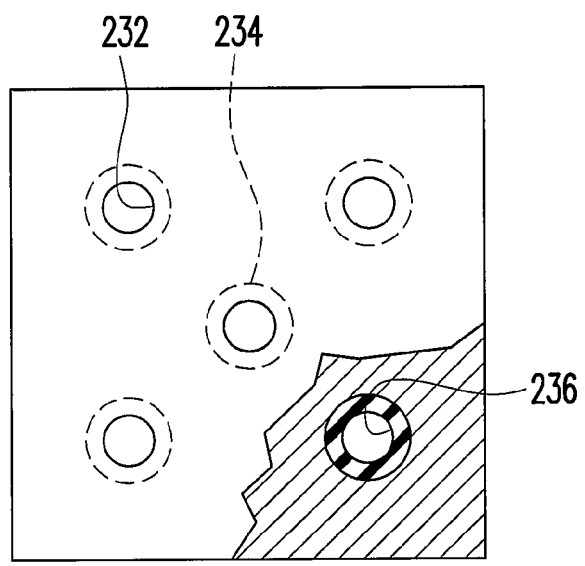
Figure 3:
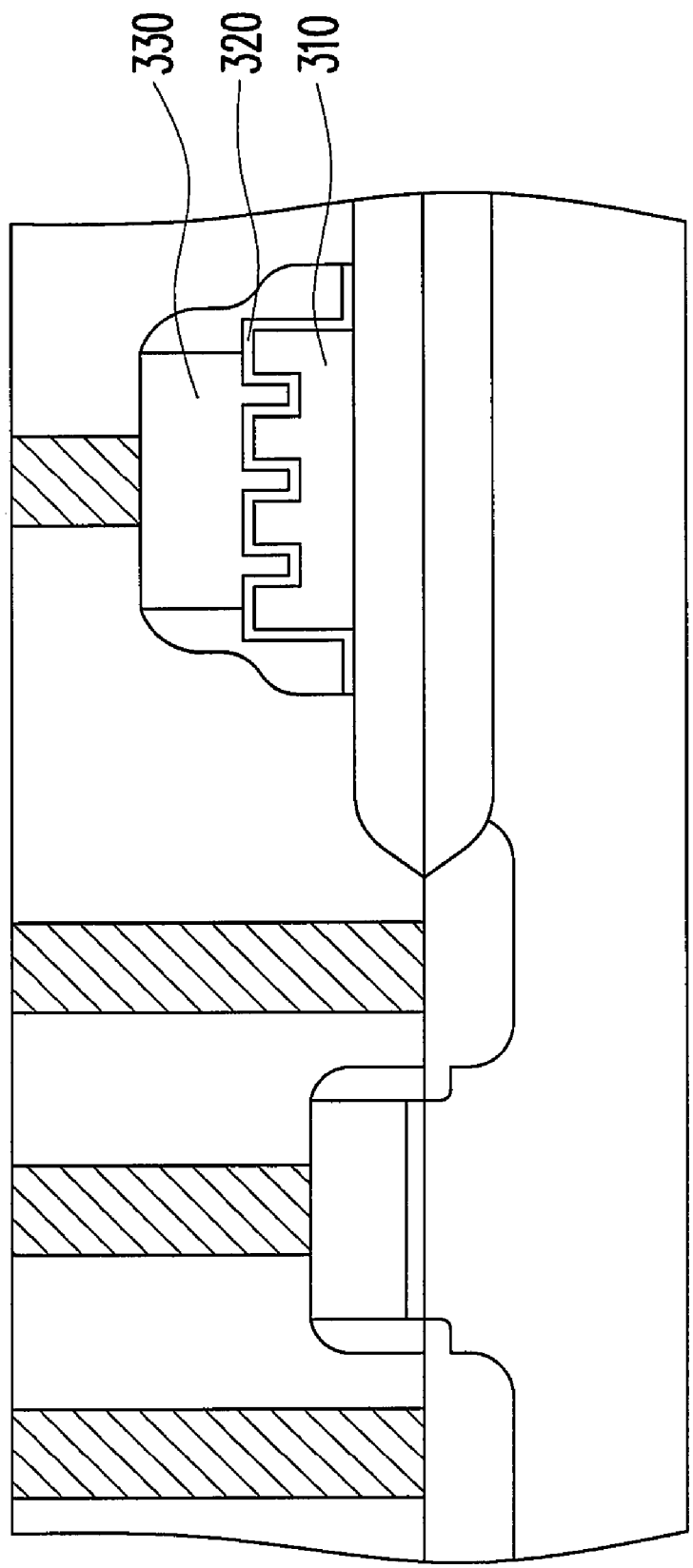
FIG. 3 is a schematic view of a structure for increasing the resistance in the conventional semiconductor process.
Figure 4A:
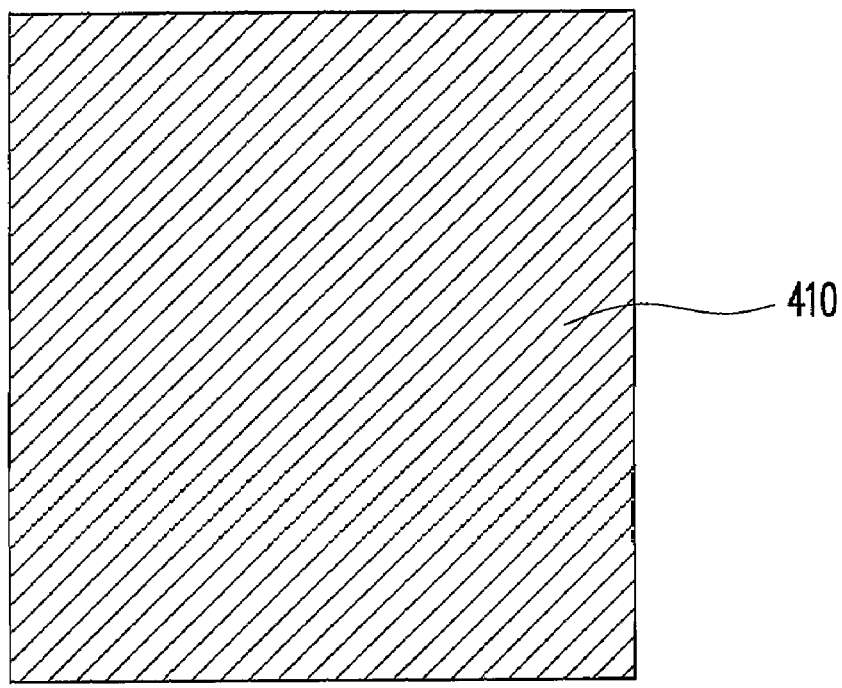
FIG. 4A and FIG. 4B are top view and schematic cross-sectional view of the flat panel resistor structure.
Figure 4B:
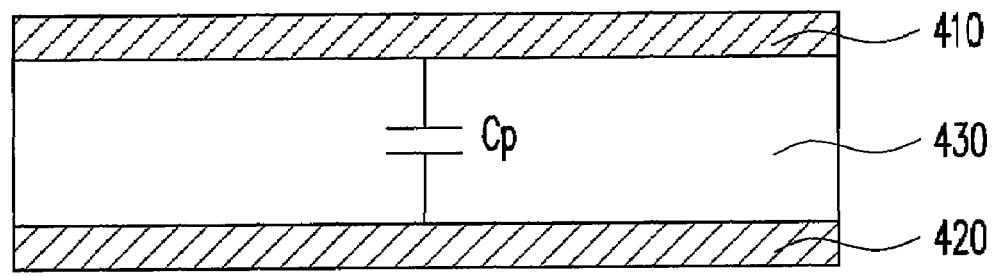

The functions and advantages of the built-in capacitor lie in that: (1) the interference of the high-frequency noise is inhibited; (2) the number of bonding layers required by bonding the printed circuit board is reduced; (3) the integration density of the electronic system is enhanced, and the area is reduced. Forming the built-in capacitor by the substrate with high dielectric coefficient mainly aims at reducing the area of the capacitor, which is not only reduced by utilizing the material, but also reduced by improving the electrical structure. The built-in capacitor structure of the plurality of electrodes according to the present invention is formed by combining a plurality of electrode plates in the same plane, such that it may be selectively designed according to the application requirements. If the capacitor substrate has certain coupling area under the condition of the same area, it is generally formed by stacking two electrode plates one on top of the other. As shown in FIG. 4A and FIG. 4B, wherein FIG. 4A is a top view and FIG. 4B is a schematic cross-sectional view, a dielectric layer 430 is sandwiched between the two electrode plates 410 and 420, and the whole structure is indicated by an equivalent capacitance Cp. The whole capacitance is obtained through a capacitance basic formula, so in a simple electrical form, the capacitance is directly proportional to the area. Further, the exit point is generally achieved by a via manufacturing process, etc. Capacitance general formula:

$$C = \varepsilon_0 \varepsilon_r \frac{A}{D} = \frac{\varepsilon A}{D}$$

wherein, C is the total capacitance, with pF as the unit;

A is the area of conductor and dielectric layer, with $m^2$ as the unit;

D is the thickness of the dielectric layer, with m as the unit;

$\in$ is the permittivity of the medium between electrode plates for the capacitor, with Farad/m (F/m) as the unit;

$\in_0$ is the relative permittivity of free space, with F/m, $1/36\pi*10-9$ F/m=8.85 pF/m as the unit; and $\epsilon_r$ is the relative permittivity of dielectric material.

Figure 5A:
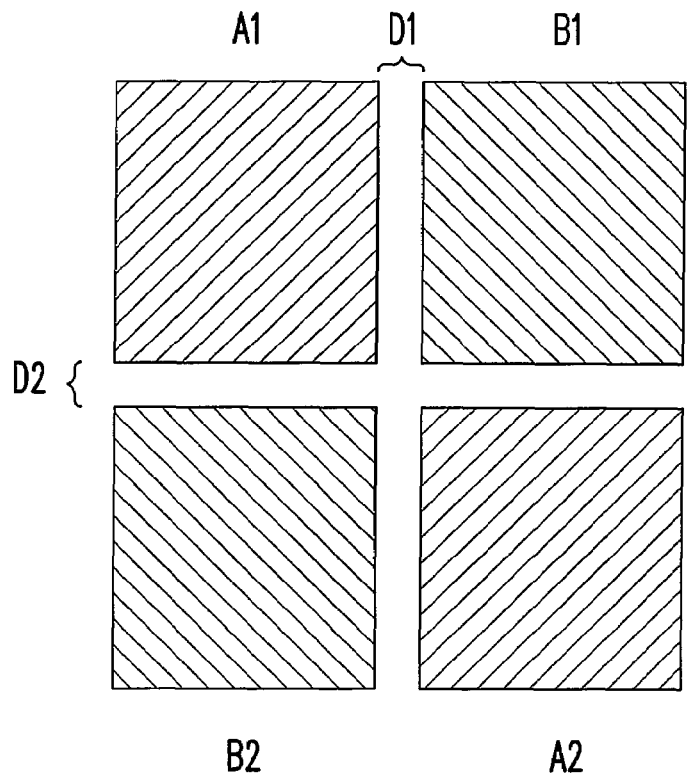
FIG. 5A and FIG. 5B are top view and schematic cross-sectional view of the built-in capacitor structure for the plurality of electrodes according to a preferred embodiment of the present invention.

However, if it is intended to increase the capacitance under the same area, the electrode plate may be divided, and there is little coupling capacitance between each divided electrode plate, so as to increase the capacitance under the same area. In the built-in capacitor structure 500 as shown in FIG. 5A, "A" is a first electrode a, "B" is a second electrode, and a dielectric layer 510 is sandwiched between the electrodes A and B. A1 is the upper layer of the electrode A, and A2 is the lower layer of the electrode A. B1 is the upper layer of the electrode B, and B2 is the lower layer of the electrode B. The distance between the upper layer A1 of the electrode A and the upper layer B1 of the electrode B is D1, and the distance between the upper layer A1 of the electrode A and the lower layer B2 of the electrode B is D2. Under the same area, after the electrode plates are divided for a certain distance, the cross twisted coupling capacitance may occur, such that the capacitance is increased under the limited area, and thereby the whole capacitance is significantly increased.

Figure 5B:
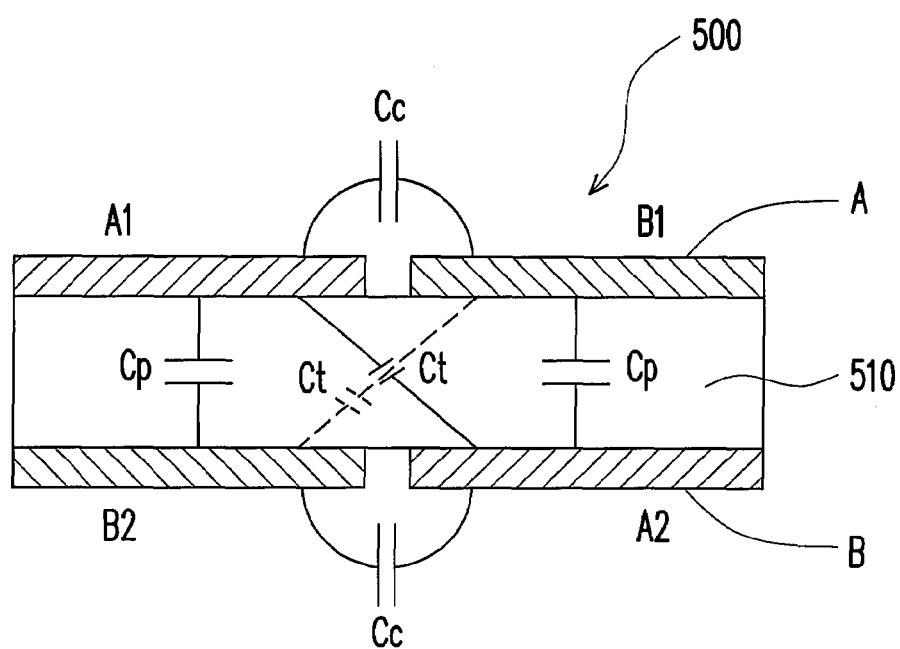

For example, as known from the cross-sectional view of FIG. 5B, a capacitance Cp exists between the upper layer A1 of the electrode A and the lower layer B2 of the electrode B, and between the lower layer A2 of the electrode A and the upper layer B1 of the electrode B. In addition, a cross twisted coupling capacitance Cc exists between the upper layer A1 of the electrode A and the upper layer B1 of the electrode B, and between the lower layer A2 of the electrode A and the lower layer B2 of the electrode B. Moreover, a cross coupling capacitance Ct exists between the upper layer A1 of the electrode A and the lower layer A2 of the electrode A, or between the upper layer B1 of the electrode B and the lower layer B2 of the electrode B. With such arrangement, the capacitance can be significantly increased. Further, the exit point of the elongated or spiral electrode plate may be fabricated by a blind hole or buried hole.

In an embodiment, the electrode A and the electrode B employ the electrode plate with the elongated electrical path. The electrode plate of the electrode A and the electrode B has a one end connection or double-end connection structure on both ends, so as to achieve the cross coupling at the upper, lower, left, and right parts and thereby increasing the capacitance. The shape of the electrode plate is not limited.

The definition of the one end connection or double-end connection is mainly directed to the electrical path. For example, the electrical path of the electrode A passes from the upper layer A1 to the lower layer A2, so it is a one end connection structure. The electrical path of the electrode B passes from the upper layer B1 to the lower layer A2, so it is also a one end connection structure. The connecting portion of the upper layer A1 and the lower layer A2, or the connecting portion of the upper layer B1 and the lower layer B2 is a strip-shaped electrode plate for connection.

In another embodiment, the electrical path of the electrode A passes from both ends of the upper layer A1 to the lower layer A2 simultaneously, and passing simultaneously herein means returning back again. For example, the electrical path of the electrode A passes from the upper layer A1 to the lower layer A2, and again goes back from the lower layer A2 back to the upper layer A1, that is, the electrical path passes from the upper layer A1 to the lower layer A2 through two contacts, i.e., the so-called double-end connection structure. The electrical path of the electrode B is a double-end connection structure passing from both ends of the upper layer B1 to the lower layer B2 simultaneously, and passing simultaneously herein means returning back again. For example, the electrical path of the electrode B passes from the upper layer B1 to the lower layer B2, and again returns back from the lower layer B2 to the upper layer B1, that is, the electrical path passes from B1 to B2 through two contacts. The connecting portion of the upper layer A1 and the lower layer A2, or the connecting portion of the upper layer B1 and the lower layer B2 is a strip-shaped electrode plate or via for connection.

The characteristics of the cross twisted coupling capacitance Cc are analyzed as follows. The area of the edge coupling capacitance equals to the width of the electrode plate multiplied by the thickness. The reduction of the distance can reduce the coupling distance of the cross twisted coupling capacitance Cc, that is, D (distance between the electrode plates) in the capacitance basic formula reduces, such that the cross twisted coupling capacitance Cc increases, such that the whole capacitance increases.

Further, if the dielectric layer 510 employs the substrate material with high dielectric coefficient, the value of the cross twisted coupling capacitance Cc is relatively large, i.e., $\in$ (dielectric coefficient) in the capacitance basic formula increases, so as to increase the whole capacitance. Therefore, the built-in capacitor of the plurality of electrodes employs the edge coupling characteristics of different electrode plates to increase the whole capacitance. Of course, in the parasitic coupling part, the cross-coupling capacitance Ct also slightly increases the whole capacitance. The built-in capacitor structure provided by the present invention is shown in FIG. 5B, and the practical operation of the built-in capacitor structure can be obtained with reference to FIG. 5C and FIG. 5D. The built-in capacitor 500 structure in an embodiment of the present invention includes an electrode A, an electrode B, and a dielectric layer sandwiched there-between. A1 is the upper layer of the electrode A, and A2 is the lower layer of the electrode A. B1 is the upper layer of the electrode B, and B2 is lower layer of the electrode B. The electrode layers A1 and A2, and the electrode layers B1 and B2 are respectively arranged in the circuit board by a manner of spirally winding in parallel as shown in FIGS. 5C and 5D.

Figure 5C:
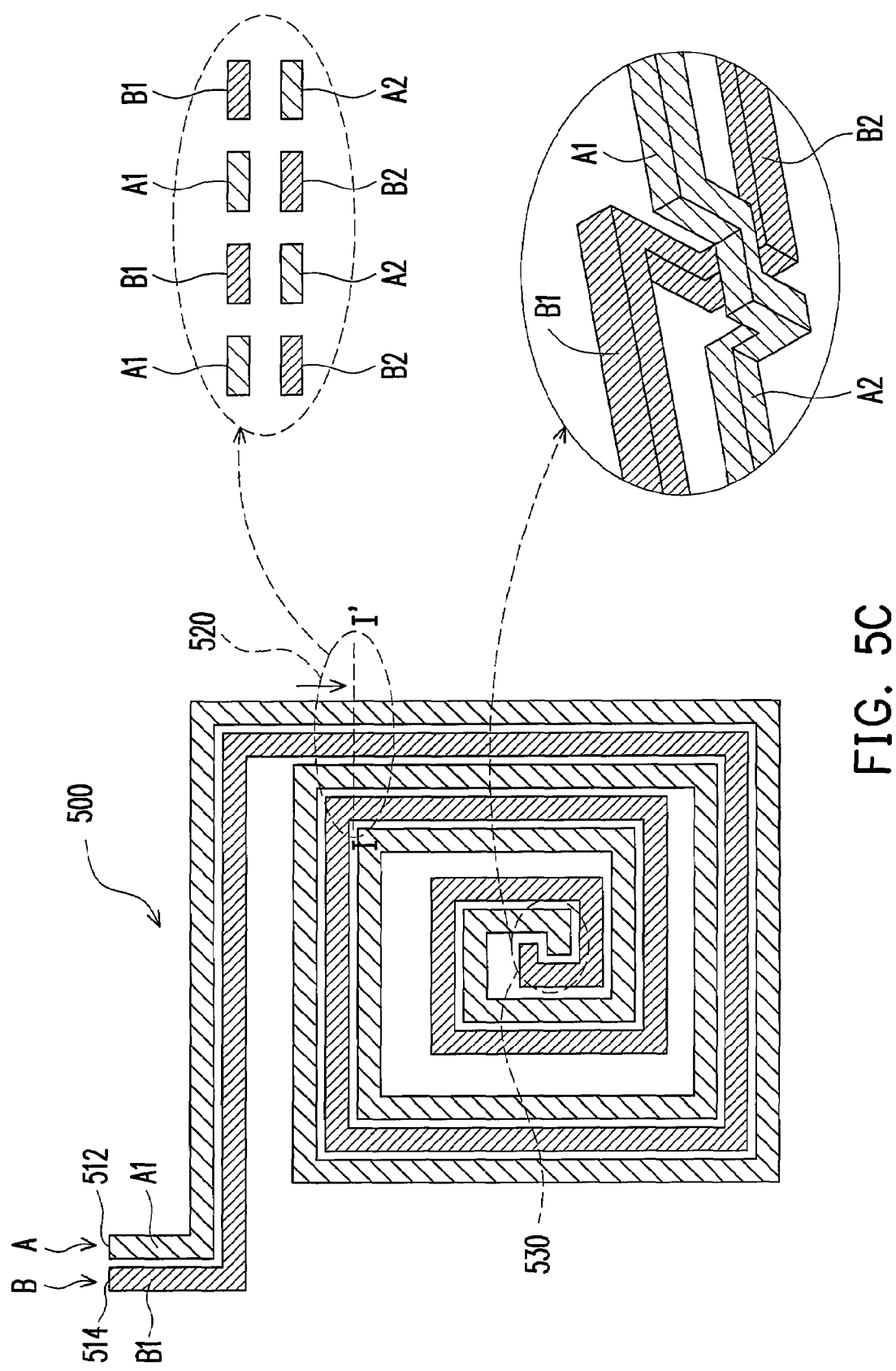
FIG. 5C and FIG. 5D are schematic top view and bottom view of a built-in capacitor structure according to an embodiment of the present invention.
Figure 5D:
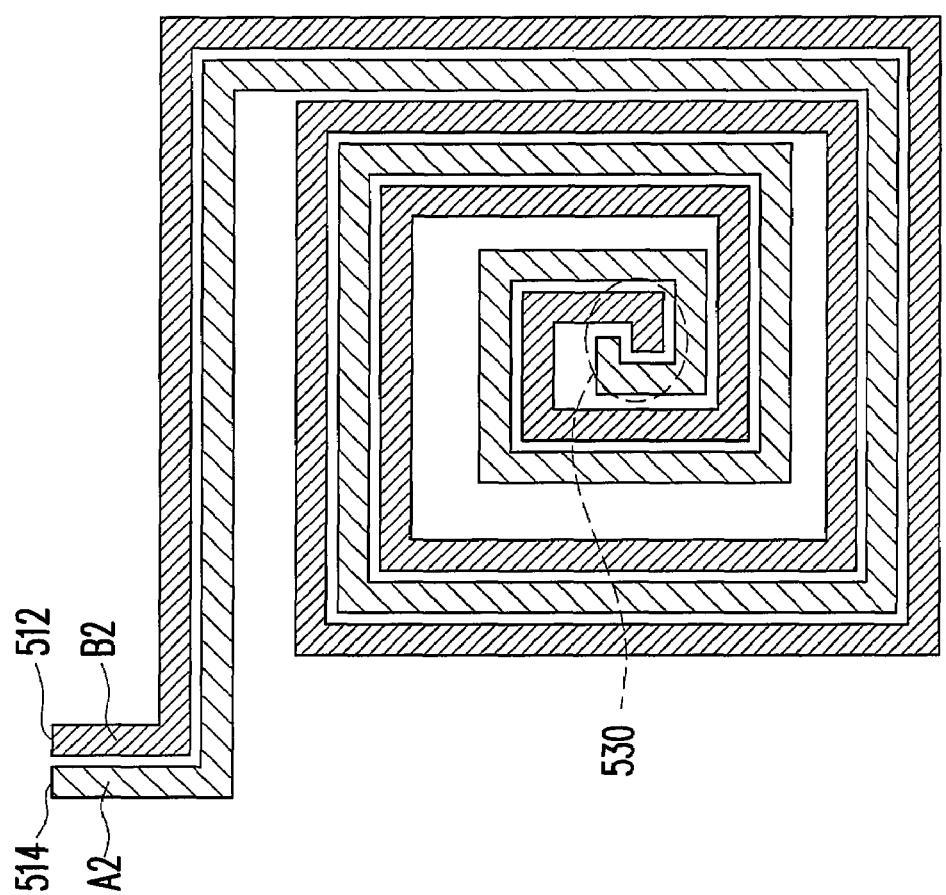

Referring to FIG. 5C, the upper layer A1 of the electrode A and the upper layer B1 of the electrode B are spirally wound in parallel from the end points 512 and 514 to the center point. Viewed from the cross section I-I' at the position of the numeral 520, the structure as shown in FIG. 5B can be appreciated, and there is cross-coupling capacitance between each electrode. As for the central position, such as the position of the numeral 530, it is shown in the enlarged structural diagram at the right part of the drawing. Then, as shown in FIG. 5D, the lower layer A2 of the electrode A and the lower layer B2 of the electrode B are spirally wound in parallel from the center point to the end points 512 and 514. The upper layer A1 and the lower layer A2 of the electrode A, and the upper layer B1 and the lower layer B2 of the electrode B are spirally wound in parallel, so as to effectively increase the capacitance under the same area. The built-in capacitor structure 500 connects to the electrode A through a pilot hole, and connects to the electrode B through another pilot hole, such that it is convenient to electrically connect to another conductive layer.

Figure 6:
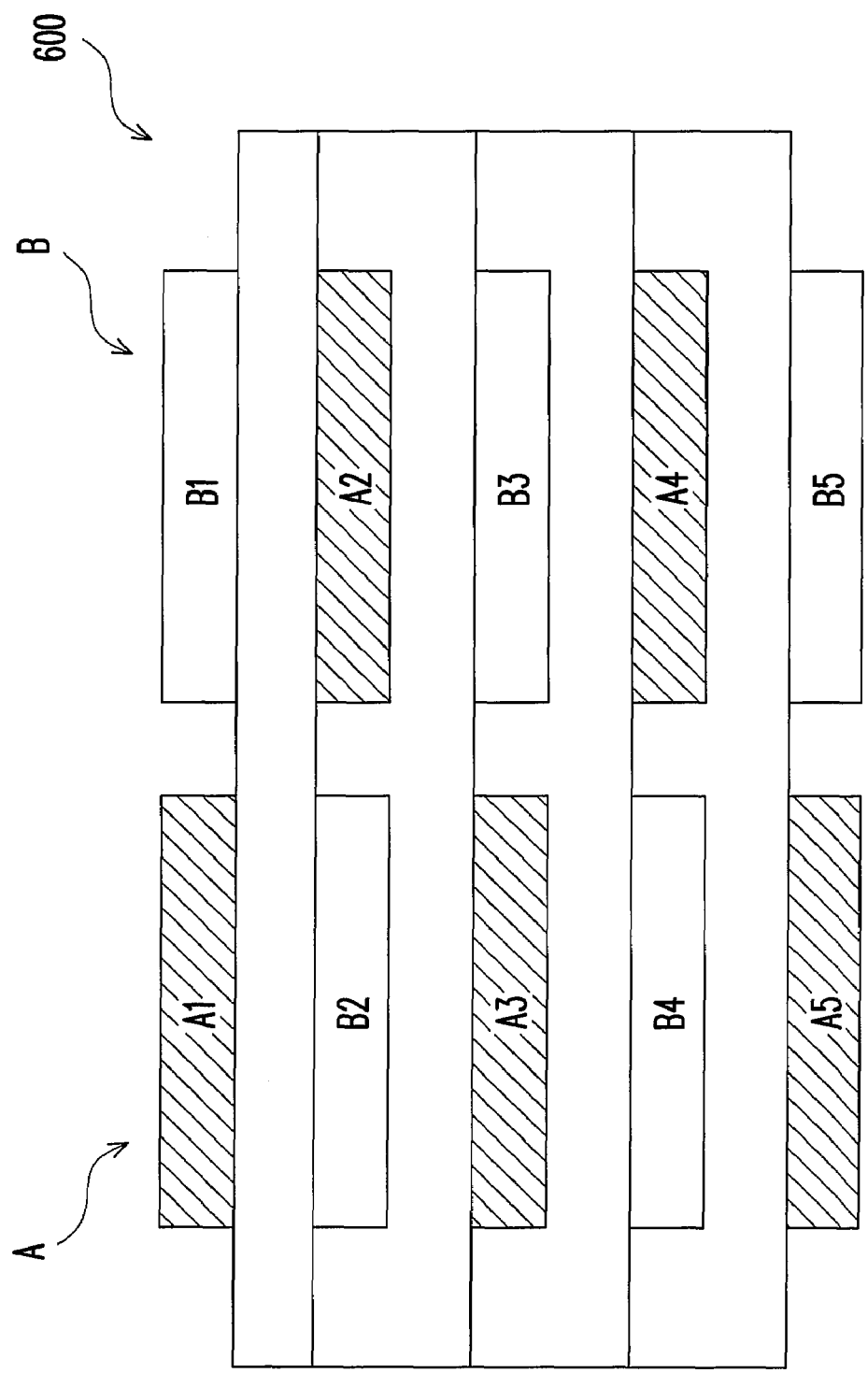
FIG. 6 is a schematic cross-sectional view of the built-in capacitor structure of the cross twisted electrode according to an embodiment of the present invention.

Of course, in order to reduce the area and meanwhile increase the capacitance, the design of a multi-layer circuit board may be used to form multi-layer electrodes at the upper and lower parts, and then increase the capacitance and reduce the area. The schematic cross-sectional view of the structure is shown in FIG. 6, it is a built-in capacitor of the cross twisted electrode according to an embodiment of the present invention. In the embodiment, the built-in capacitor structure 600 includes an electrode A, an electrode B, and a dielectric layer sandwiched there-between. The electrode A includes electrode layers A1, A2, A3, A4, and A5, and the electrode B includes electrode layers B1, B2, B3, B4, and B5. The electrode layers A1, A2, A3, A4, and A5, and the electrode layers B1, B2, B3, B4, and B5 are respectively arranged in the multi-layer circuit board by way of spirally winding in parallel as shown in FIGS. 5C and 5D.

Figure 7:
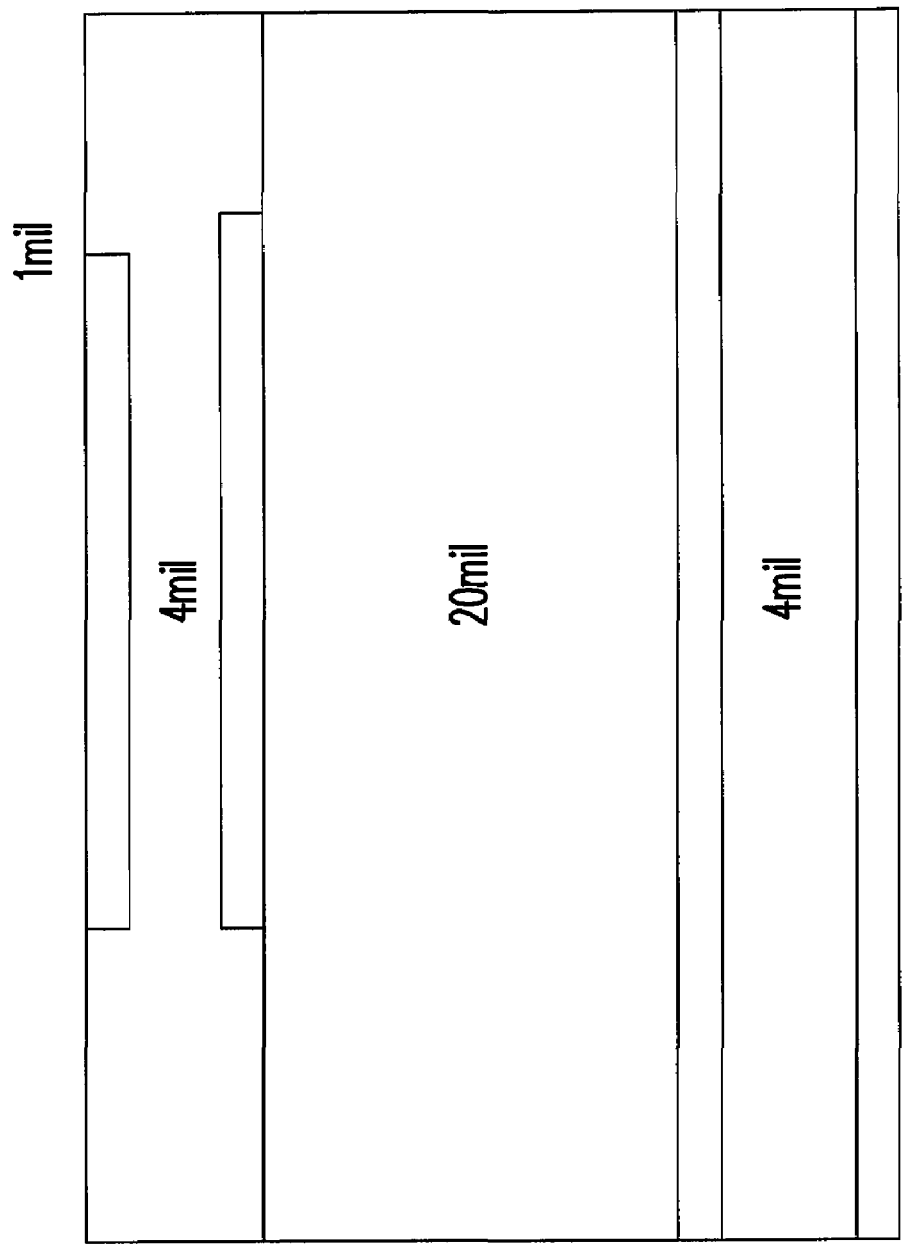
FIG. 7 is a schematic view of the cross-sectional dimension of the built-in capacitor structure according to an embodiment of the present invention.

As for the built-in capacitor structures obtained from practical manufacturing process, referring to FIG. 7, they are obtained by employing HiDK40 with the line width and line distance of 2 mils through an accurate process. As viewed from the capacitance in an area of 60×60 mil$^2$, the substrate structure is as shown in FIG. 7. In the following several capacitor structures, including the I type structure to the IV type structures of FIG. 8A to FIG. 8D, the observation results are described according to different examples.

Figure 8A:
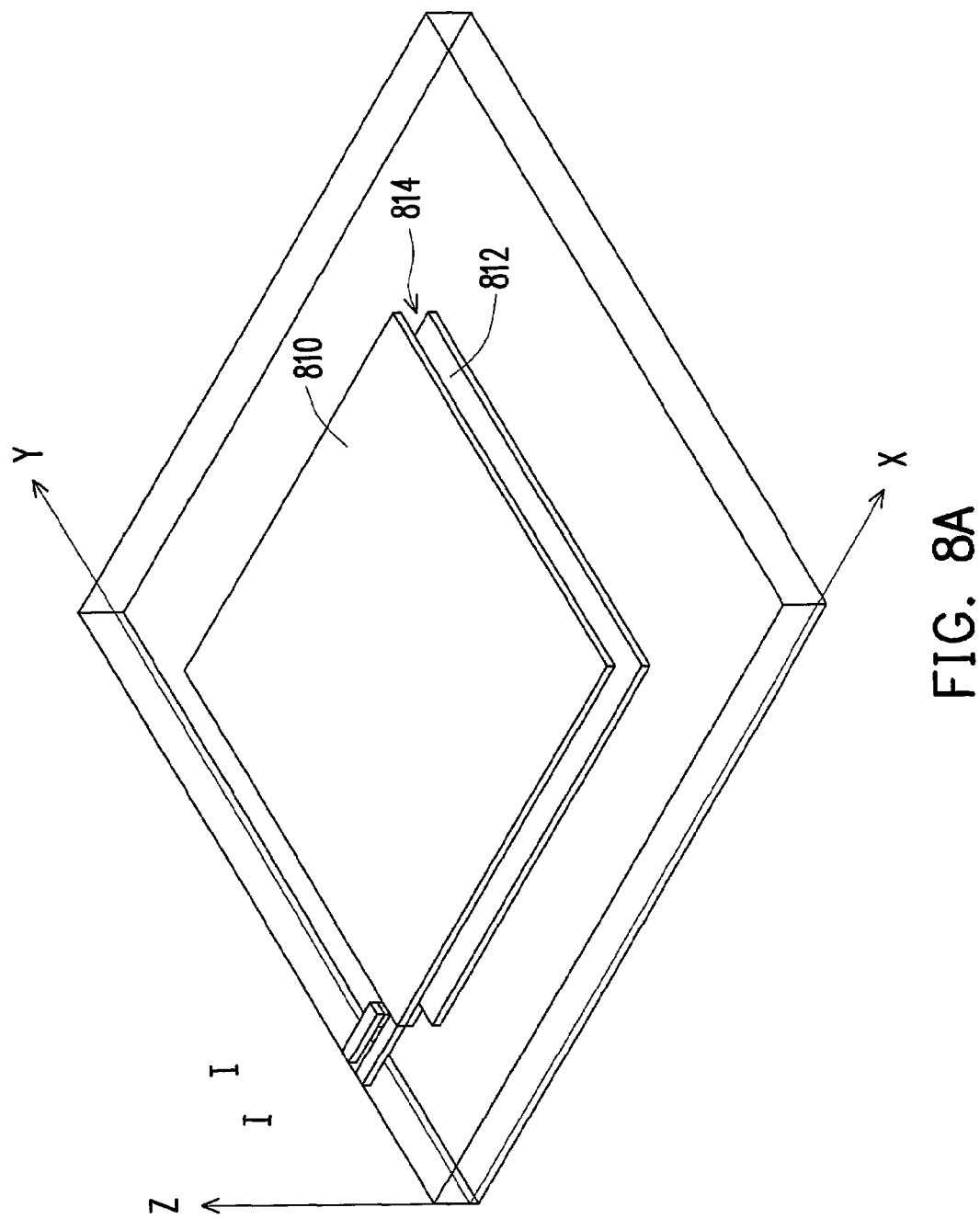

Referring to FIG. 8A, the I-type capacitor structure is described. The capacitor structure is a flat panel metal-insulator-metal (MIM) capacitor structure as shown in the figure, that is, the capacitor structure is formed by a metal layer 810, a metal layer 812, and an insulator layer 814 sandwiched there-between. The capacitance tested for this structure is 10.3753 pF.

Figure 8B:
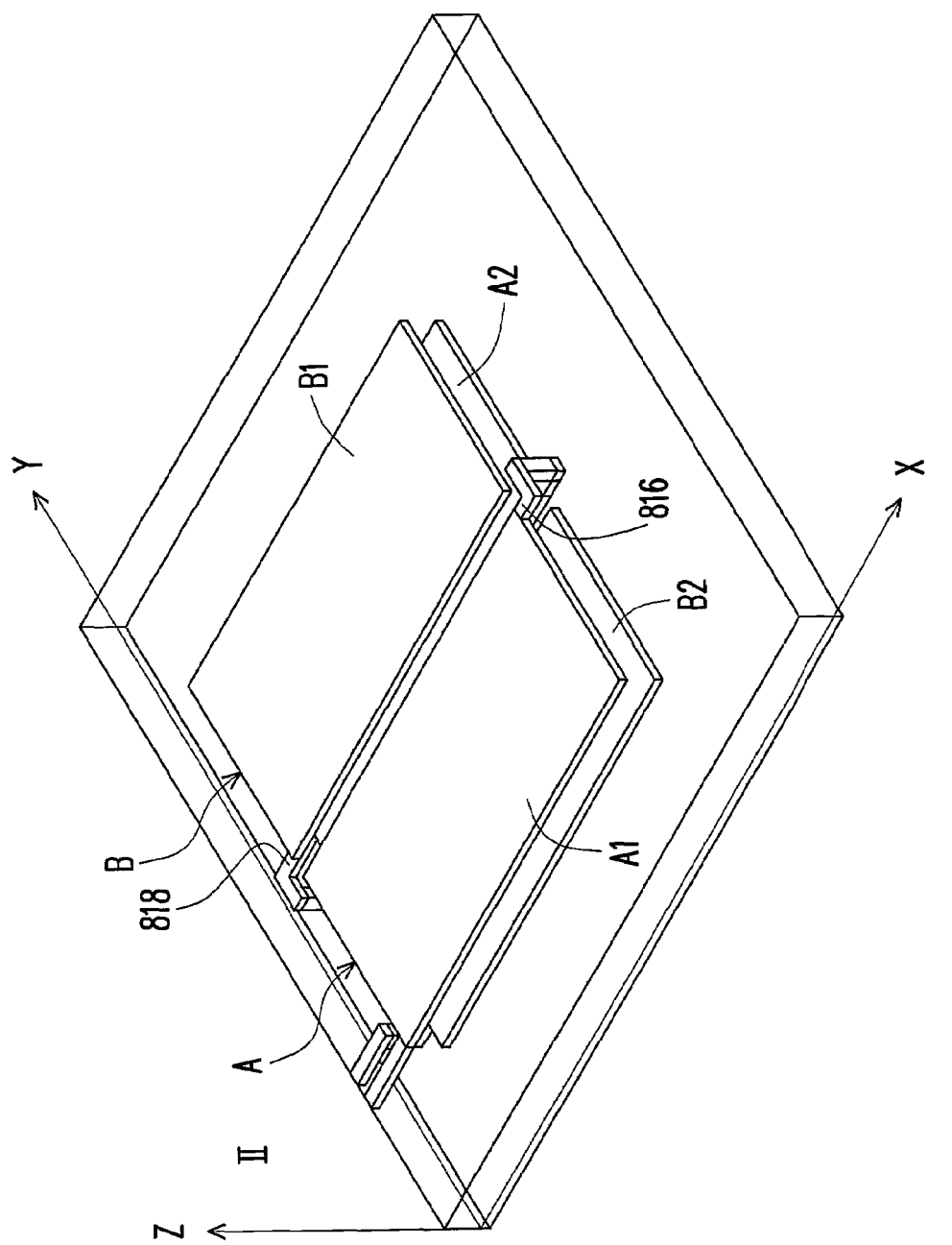

Referring to FIG. 8B, the II-type capacitor structure is described. As shown in FIG. 8B, the capacitor structure is formed by an electrode A, an electrode B, and a dielectric layer sandwiched there-between. The layer A1 of the electrode A and the lower layer B2 of the electrode B are arranged one on top of the other, and further, the upper layer B1 of the electrode B and the lower layer A2 of the electrode A are alternately arranged one on top of the other. The upper layer A1 and the lower layer A2 of the electrode A are connected to each other by the connecting structure 816, and the upper layer B1 and the lower layer B2 of the electrode B are connected to each other by the connecting structure 818. The capacitance tested for the structure is 11.1153 pF.

Figure 8C:
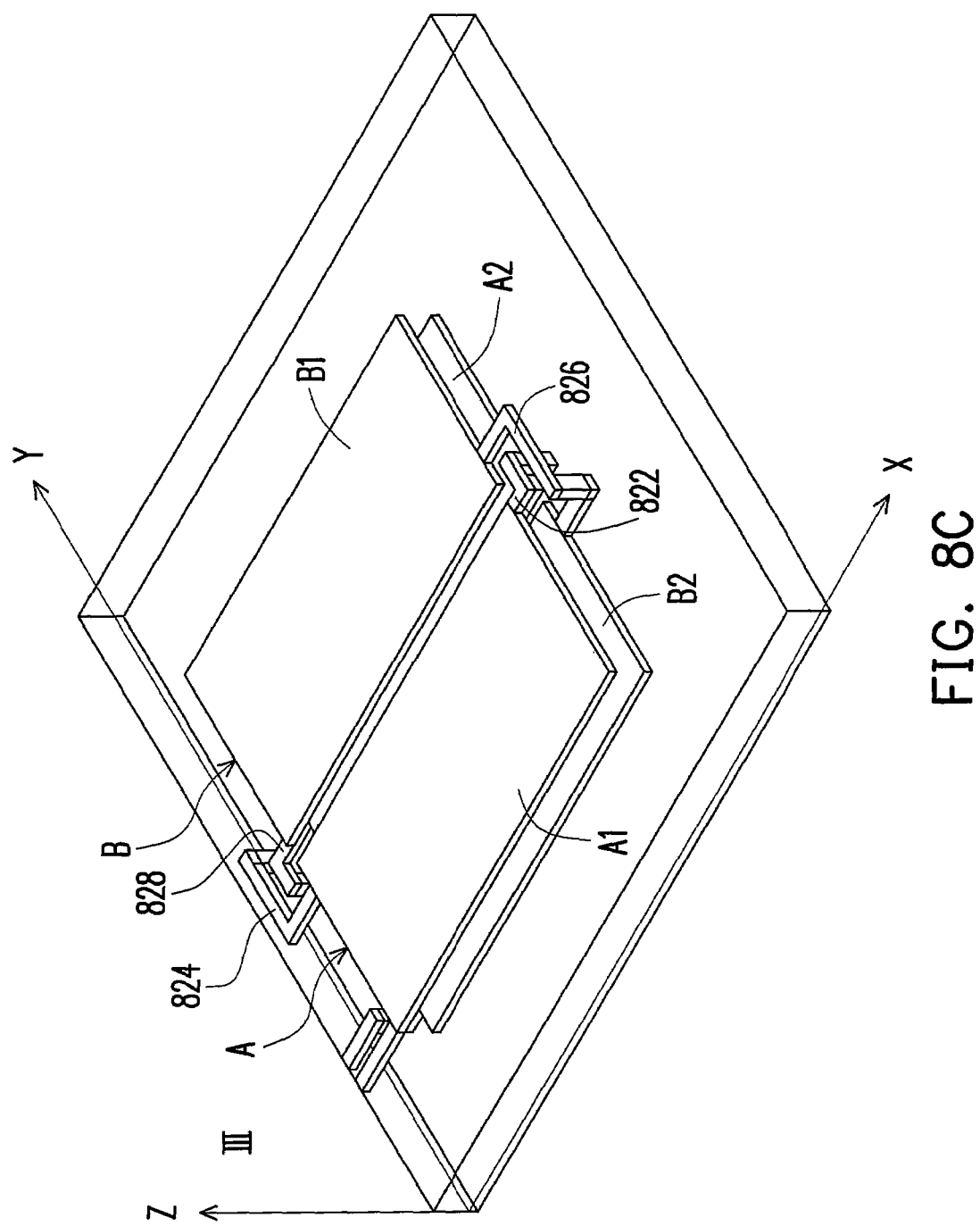

Further, referring to FIG. 8C, the III-type capacitor structure is described. As shown in FIG. 8C, the capacitor structure is formed by an electrode A, an electrode B, and a dielectric layer sandwiched there-between. The upper layer A1 of the electrode A and the lower layer B2 of the electrode B are arranged one on top of the other, and furthermore, the upper layer B1 of the electrode B and the lower layer A2 of the electrode A are alternately arranged one on top of the other. The difference between this capacitor structure and that shown in FIG. 8B lies in that, it is connected by the connecting structure 822 from the upper layer A1 to the lower layer A2 of the electrode A, but it is connected by the connecting structure 824 from the lower layer A2 to the upper layer A1; and it is connected by the connecting structure 826 from the lower layer B2 to the upper layer B1 of the electrode B, but it is connected by the connecting structure 828 from the upper layer B1 to the lower layer B2. The capacitance tested for the structure is 10.8911 pF.

Further, referring to FIG. 8D, the IV-type capacitor structure is described. The capacitor structure is the one shown in FIG. 5C and FIG. 5D, which is formed by an electrode A, an electrode B, and a dielectric layer sandwiched there-between. A1 is the upper layer of the electrode A, and A2 is the lower layer of the electrode A. B1 is the upper layer of the electrode B, and B2 is the lower layer of the electrode B. The upper layer A1 of the electrode A and the upper layer B1 of the electrode B are spirally wound in parallel from the end points 832 and 834 to the center point. After reaching the central position, the lower layer A2 of the electrode A and the lower layer B2 of the electrode B are spirally wound in parallel from the center point back to the end points 832 and 834. The upper layer A1 and the lower layer A2 of the electrode A, and the upper layer B1 and the lower layer B2 of the electrode B are spirally wound in parallel, so as to effectively increase the capacitance under the same area. The capacitance tested for the structure is 19.1513 pF. Compared with the I-type capacitor structure, i.e., the flat panel MIM capacitor, the IV-type capacitor structure increases the capacitance for nearly 80%.

As known from the above practical observation results, in the built-in capacitor structure of the present invention, the cross coupling designs at the upper, lower, left, and right parts are achieved by an elongated electrical path. Leads or electrode plates are coupled through coupling an electrode above or below or aside the other electrode. By cross coupling and with fewer vias, the largest capacitance value can be obtained within a minimum area.

Figure 9A:
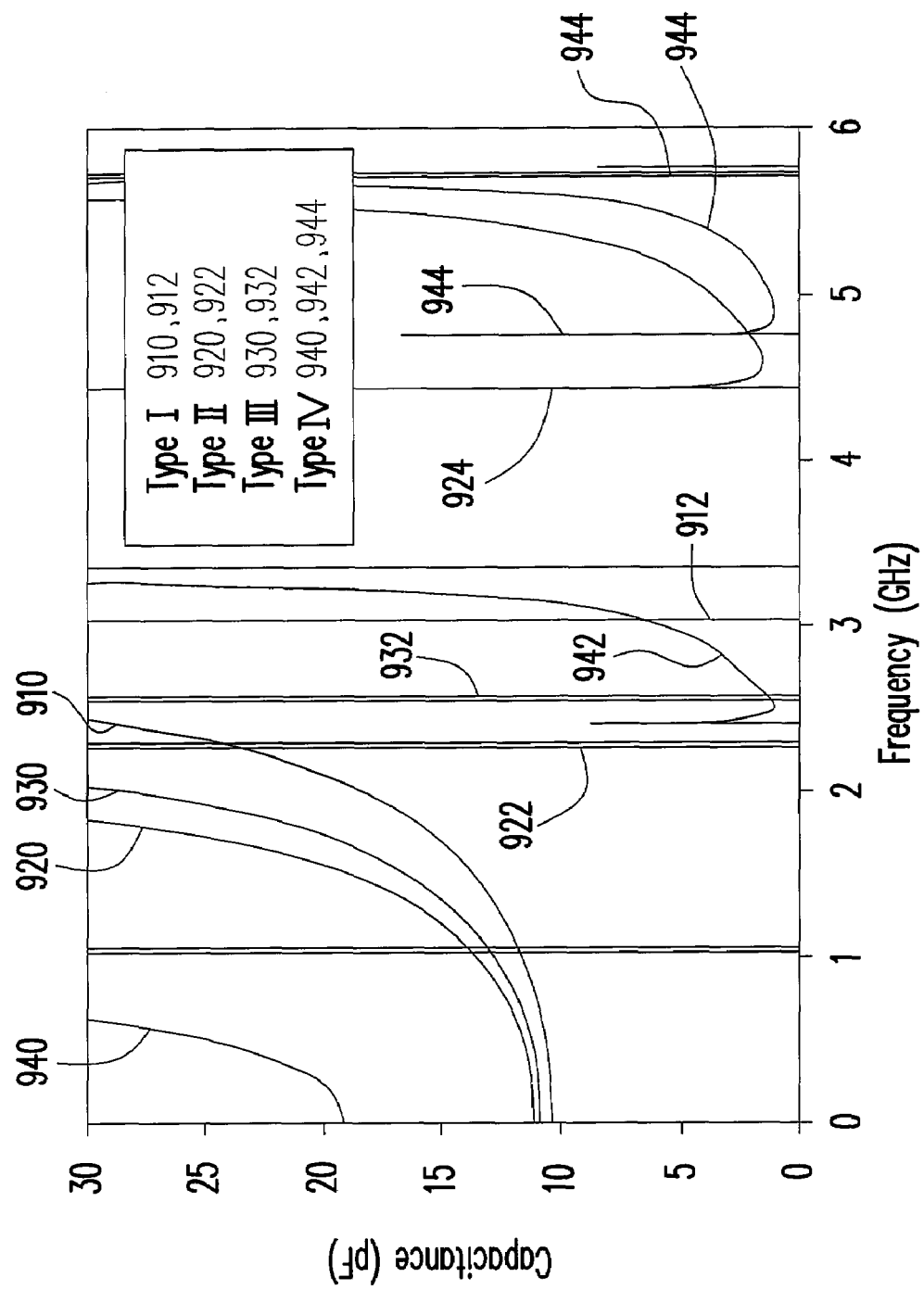
FIG. 9A-FIG. 9B are schematic views of the relations between the capacitance and the frequency for the capacitor structures of the I-type structure to the IV-type structure of FIG. 8A to FIG. 8D.
Figure 9B:
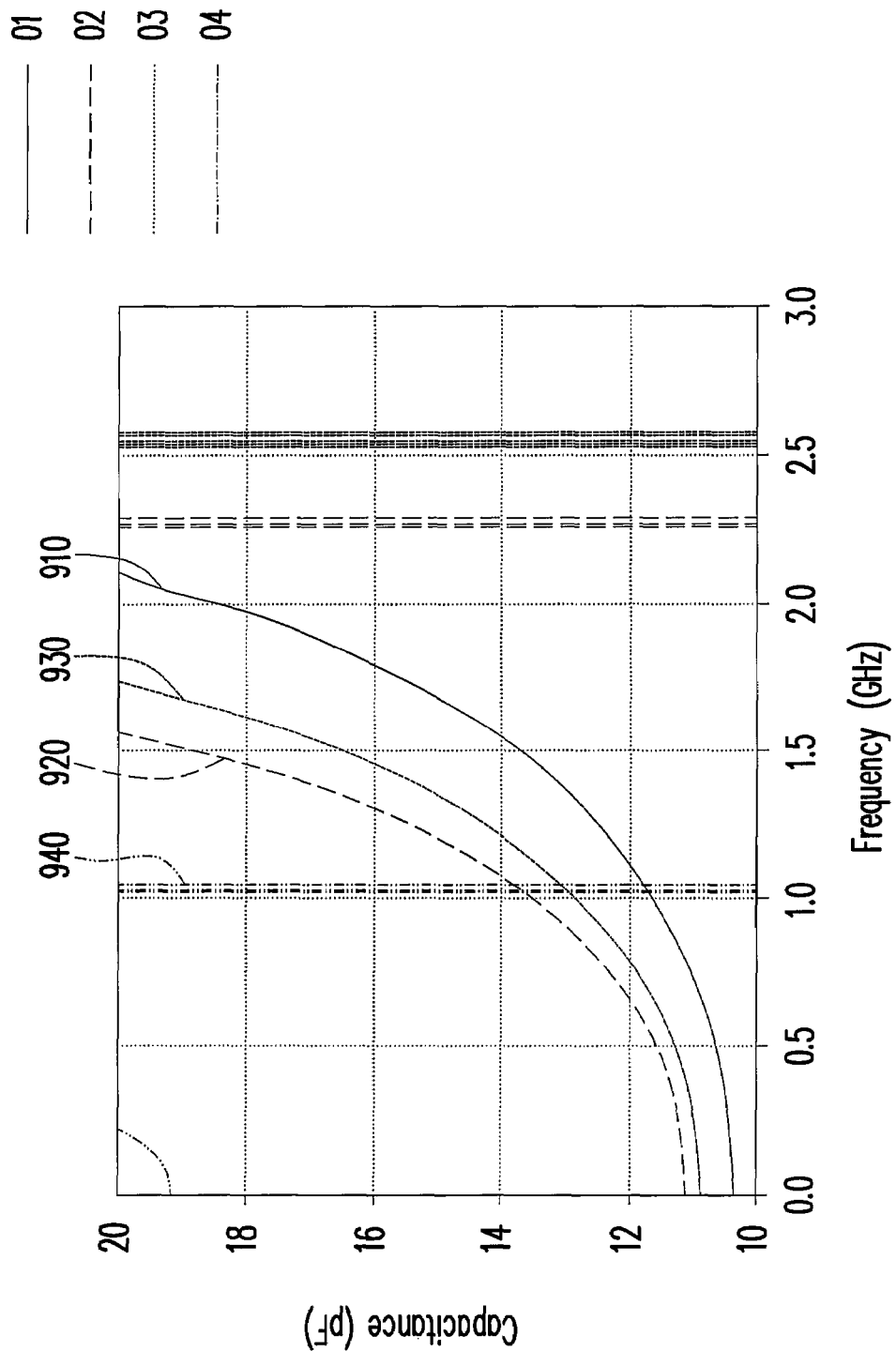

In addition, referring to FIG. 9A and FIG. 9B, they are curves of the capacitance versus the frequency with an area of 50×50 mil$^2$, as for the capacitor structures in I-type structure to the IV-type structure of FIG. 8A to FIG. 8D. As seen from FIG. 9A, the changes of the capacitance for the I-type capacitor structure versus the frequency from 0-6 GHz can be known, including the curves 910 and 912, the changes of the capacitance for the II-type capacitor structure versus the frequency from 0-6 GHz can be known, including the curves 920, 922, and 924, the changes of the capacitance for the III-type capacitor structure versus the frequency from 0-6 GHz can be known, including the curves 930 and 932, and the changes of the capacitance for the IV-type capacitor structure versus the frequency from 0-6 GHz also can be know, including the curves 940, 942, and 944. FIG. 9B mainly shows the changes of the capacitance versus the frequency at an enlarged frequency of 0-3 GHz according to FIG. 9A. The built-in capacitor structure provided in the present invention also can be applied to a high-frequency high-speed module or system to enhance noise reduction capability of the capacitive substrate. When it is applied to common circuit designs, the minimum area design may be achieved as well, such that it meets the object of system in package for the electronic system in the future. As for the built-in capacitor structure provided by the present invention, with different frequencies, the capacitances are different due to being affected by the nature-vibration frequency. Even under a high frequency, the large capacitor has already exceeded the nature-vibration frequency to become inductive. Therefore, compared to the former low frequency (0 Hz), it is increased from 10.5 pF to 19.0 pF by nearly 80%.

The built-in capacitor structure provided by the present invention is suitable for embedded capacitor structures in various fields. It may be applied in the field for manufacturing the multi-layer printing organic substrate to form a stereo alternately embedded capacitor structure, or it may be applied in the field for manufacturing the integrated circuit to form the stereo alternately embedded capacitor structure, or it may be applied in the nano material application field to form a stereo alternately embedded capacitor structure, or it may be applied in the biomedicine or medical engineering application field to form a stereo alternately embedded capacitor structure, or it may be applied in the field for manufacturing the commercial available chip capacitor to form a stereo alternately embedded capacitor structure.

Figure 10:
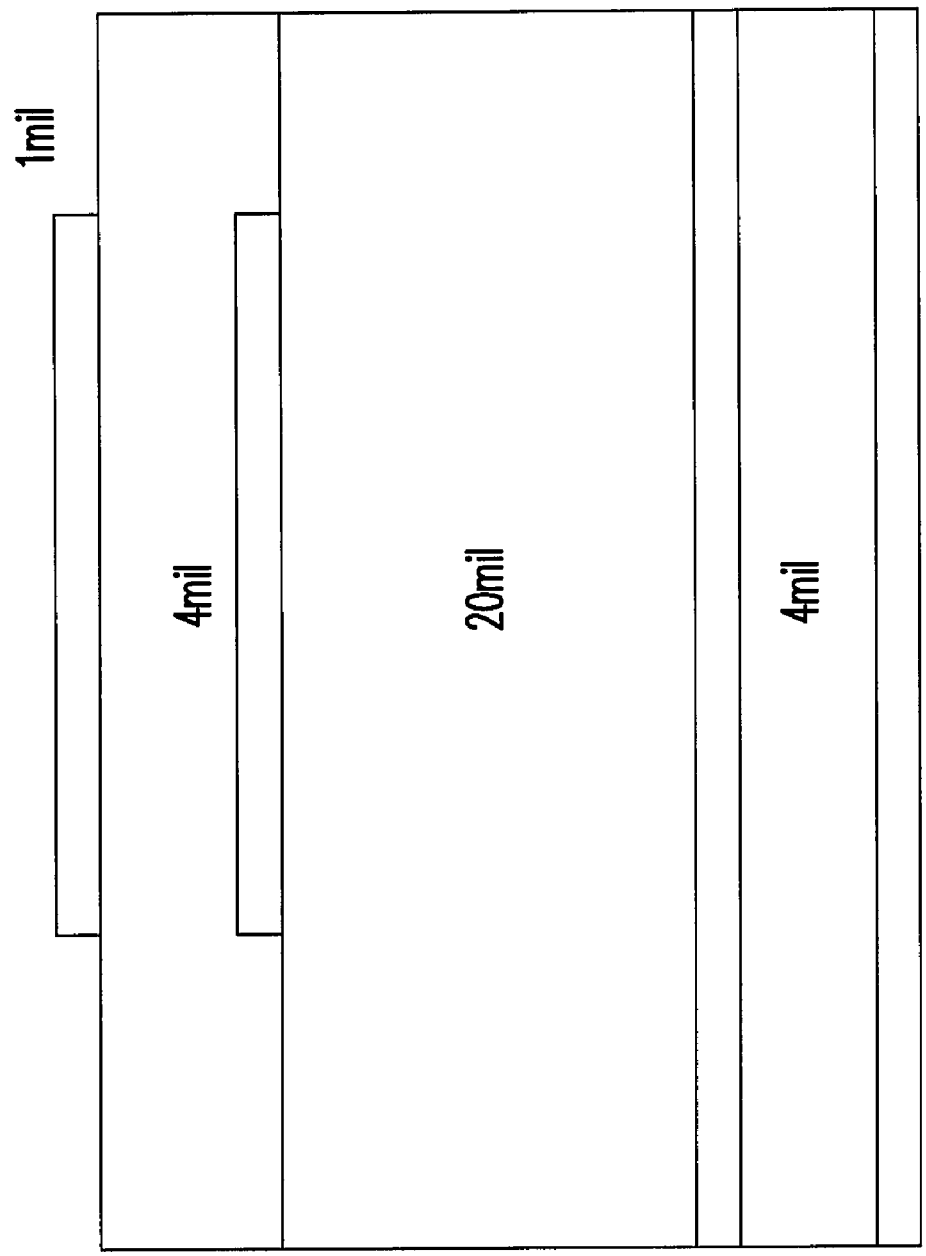
FIG. 10 is a schematic view of the cross-sectional dimension of the built-in capacitor structure according to another embodiment of the present invention.

FIG. 10 shows the built-in capacitor structure according to another embodiment of the present invention. The difference between the structure of FIG. 10 and that of FIG. 7 lies in whether the metal plate is embedded within the medium, but both can be used for increasing the capacitance of the present invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A capacitor structure, comprising:
   a dielectric material layer; and
   a first electrode and a second electrode, with the dielectric material layer disposed therebetween, wherein the first electrode comprises a first electrode layer and a second electrode layer connected together and the second electrode comprises a third electrode layer and a fourth electrode layer connected together; the first electrode layer and the third electrode layer are located on a first plane and the second electrode layer and the fourth electrode are located on a second plane that is parallel to the first plane; the fourth electrode layer is disposed below the first electrode layer and the second electrode layer is disposed below the third electrode layer, wherein the first electrode layer, the second electrode layer, the third electrode layer, and the fourth electrode layer are spirally wound.

2. The capacitor structure as claimed in claim 1, wherein the first electrode layer, the second electrode layer, the third electrode layer, and the fourth electrode layer are flat conductive layers and are spaced apart in parallel with each other, wherein the electrical path is a single end connection structure extending from the first electrode layer to the second electrode layer, and the electrical path of the second electrode is a single end connection structure extending from the third electrode layer to the fourth electrode layer.

3. The capacitor structure as claimed in claim 1, wherein connecting portion of the first electrode layer and the second electrode layer, and connecting portion of the third electrode layer and the fourth electrode layer are connected by conductive materials.

4. The capacitor structure as claimed in claim 1, wherein the first electrode layer, the second electrode layer, the thirst electrode layer, and the fourth electrode are strip-shaped conductive layers; the first electrode layer and the third electrode layer are spirally wound in parallel in a first direction, and after reaching the center, the second electrode layer and the fourth electrode layer are spirally wound in parallel in a second direction, opposite to the first direction.

5. The capacitor structure as claimed in claim 1, wherein the first electrode layer comprises a first end serving as a first terminal of the capacitor structure and a second end connected with the second electrode layer of the first electrode, and the third electrode layer comprises a first end serving as a second terminal of the capacitor structure and a second end connected with the fourth electrode layer of the second electrode, the first terminal and the second terminal being adapted for connecting the capacitor structure with an external circuit.

6. A capacitor structure, comprising:
   a dielectric material layer; and
   a first electrode and a second electrode, with the dielectric material layer disposed therebetween, wherein the first electrode comprises a first electrode layer and a second electrode layer connected together and the second electrode comprises a third electrode layer and a fourth electrode layer connected together; the first electrode layer and the third electrode layer are located on a first plane and the second electrode layer and the fourth electrode are located on a second plane that is parallel to the first plane; the fourth electrode layer is disposed below the first electrode layer and the second electrode layer is disposed below the third electrode layer, wherein the first electrode layer, the second electrode layer, the third electrode layer, and the fourth electrode layer are flat conductive layers and are spaced apart in parallel with each other, wherein the electrical path of the first electrode is a double end connection structure extending from two ends of the first electrode layer to two ends of the second electrode layer, and the electrical path of the second electrode is a double end connection structure extending from two ends of the third electrode layer to two ends of the fourth electrode layer.

7. The capacitor structure as claimed in claim 6, wherein connecting portion of the first electrode layer and the second electrode layer, and connecting portion of the third electrode layer and the fourth electrode layer are connected to each other by strip-shaped electrode plates.

8. A capacitor structure, comprising:
a plurality of dielectric material layers; and
a first electrode and a second electrode, having multi-layer structures and with the dielectric material layers disposed between the first electrode and the second electrode, wherein the first electrode comprises a plurality of first electrode layers connected together and the second electrode comprises a plurality of second electrode layers connected together; the first electrode layers and the second electrode layers are disposed in parallel on a plane of each layer, and the second electrode layers are located above and/or under each of the first electrode layers, and the first electrode layers are located above and/or under each of the second electrode layers, wherein each of the first electrode layers and the second electrode layers is spirally wound.

9. The capacitor structure as claimed in claim 8, wherein the first electrode layers and the second electrode layers are flat conductive layers and are spaced apart in parallel with each other.

10. The capacitor structure as claimed in claim 8, wherein a connection of connecting each electrode layer of the first electrode is a single end connection structure, and a connection of each electrode layer of the second electrode is a single end connection structure.

11. The capacitor structure as claimed in claim 8, wherein a connection of each electrode layer of the first electrode is a double end connection structure, and a connection of each electrode layer of the second electrode is a double end connection structure.

12. The capacitor structure as claimed in claim 8, wherein the first electrode layers and the second electrode layers are strip-shaped conductive layers; the first electrode layer and the second electrode layer on a same plane are spirally wound in parallel in a first direction, and after reaching the central position, the first electrode layer and the second electrode layer on the next plane are spirally wound in parallel in a second direction, opposite to the first direction.

13. The capacitor structure as claimed in claim 12, wherein the first electrode layers and the second electrode layers are positioned spirally and the second electrode layers is positioned below or above the first electrode layers.

14. A capacitor structure, comprising:
a first electrode comprising a first electrode layer and a second electrode layer;
a second electrode comprising a third electrode layer and a fourth electrode layer; and
a dielectric material layer disposed between the first electrode and the second electrode,
wherein the first electrode layer and the second electrode layer of the first electrode are electrically connected by a first bridge structure, and the third electrode layer and the fourth electrode layer are electrically connected by a second bridge structure,
the first electrode layer and the third electrode layer are located on a first plane and the second electrode layer and the fourth electrode are located on a second plane that is parallel to the first plane;
the fourth electrode layer is disposed below the first electrode layer and the second electrode layer is disposed below the third electrode layer; and
the first electrode layer further comprises a first contact member serving as a first terminal of the capacitor structure and the fourth electrode layer further comprises a second contact member serving as a second terminal of the capacitor structure, the first terminal and the second terminal being adapted for connecting the capacitor structure with an external circuit.

15. The capacitor structure as claimed in claim 14, wherein the third electrode layer further comprises a third contact member together with the second contact member of the fourth electrode serving as the second terminal of the capacitor structure, and the second electrode layer further comprises a fourth contact member together with the first contact member of the first electrode layer serving as the first terminal of the capacitor structure.

* * * * *